(12) United States Patent
Vögeli et al.

(10) Patent No.: US 6,774,052 B2
(45) Date of Patent: Aug. 10, 2004

(54) METHOD OF MAKING NANOTUBE PERMEABLE BASE TRANSISTOR

(75) Inventors: Bernhard Vögeli, Boston, MA (US); Thomas Rueckes, Watertown, MA (US); Brent M. Segal, Medford, MA (US)

(73) Assignee: Nantero, Inc., Woburn, MA (US)

( * ) Notice: Subject to any disclaimer, the term of this patent is extended or adjusted under 35 U.S.C. 154(b) by 70 days.

(21) Appl. No.: 10/174,889

(22) Filed: Jun. 19, 2002

(65) Prior Publication Data

US 2003/0236000 A1 Dec. 25, 2003

(51) Int. Cl.⁷ .......................... H01L 21/31; H01L 21/469
(52) U.S. Cl. ....................... 438/778; 438/903; 438/780; 438/782; 427/216; 205/766
(58) Field of Search .................. 438/778, 780, 438/782, 903; 427/216; 205/766

(56) References Cited

U.S. PATENT DOCUMENTS

| | | | |
|---|---|---|---|
| 4,324,814 A | 4/1982 | Reichert | 427/86 |
| 4,378,629 A | 4/1983 | Bozler et al. | 29/580 |
| 4,495,511 A | 1/1985 | Yoder | 357/22 |
| 4,510,016 A | 4/1985 | Chi et al. | 156/643 |
| 4,707,197 A | 11/1987 | Hensel et al. | 437/189 |
| 4,758,534 A | 7/1988 | Kerkits, Jr. et al. | 437/89 |
| 4,901,121 A | 2/1990 | Gibson et al. | 357/15 |
| 4,903,090 A | 2/1990 | Yokoyama | 357/22 |
| 5,010,037 A | 4/1991 | Lin et al. | 437/200 |
| 5,032,538 A | 7/1991 | Bozler et al. | 437/83 |
| 5,057,883 A | 10/1991 | Noda | 357/22 |
| 5,155,561 A | 10/1992 | Bozler et al. | 257/773 |
| 5,168,070 A | 12/1992 | Lüth | 437/31 |
| 5,175,597 A | 12/1992 | Cachier et al. | 257/267 |
| 5,290,715 A | 3/1994 | Pandya | 437/31 |
| 5,298,787 A | 3/1994 | Bozler et al. | 257/592 |
| 5,563,424 A | 10/1996 | Yang et al. | 257/40 |
| 6,346,189 B1 * | 2/2002 | Dai et al. | 205/766 |
| 6,465,813 B2 | 10/2002 | Ihm | 257/183 |

OTHER PUBLICATIONS

Wernersson et al., "Performance and design of vertical, ballistic, heterostructure field–effect transistors," *Materials Science and Engineering*, 1998, pp. 76–80.

Nilsson et al., "An investigation of the blocking characteristics of the permeable base insistor," *Solid–State Electronics*, vol. 42, No. 3., 1998, pp. 297–305.

Kanel, "Growth and characterization of epitaxial Ni and Co silicides," *Material Science Reports*, 1992, pp. 193–269.

Reader et al., "Transition metal silicides in silicon technology," *Rep. Prog. Phys.* 56, 1992, pp. 1397–1467.

Zaring et al., "Solid solubility and diffusion of boron in single–crystalline cobalt disilicide," *J. Appl. Phys.* 80, 1996, pp. 2742–2748.

Hsu et al., "Epitaxial growth of CoSi2 on (111)Si inside miniature–size oxide openings by rapid thermal annealing," *J. Appl. Phys.* 69, 1991, pp. 4282–4285.

(List continued on next page.)

*Primary Examiner*—David Nelms
*Assistant Examiner*—Reneé R. Berry
(74) *Attorney, Agent, or Firm*—Hale and Dorr LLP

(57) ABSTRACT

A method of making a permeable base transistor (PBT) is disclosed. According to the method, a semiconductor substrate is provided, a base layer is provided on the substrate, and a semiconductor layer is grown over the base layer. The base layer includes metallic nanotubes, which may be grown or deposited on the semiconductor substrate. The nanotube base layer separates emitter and collector layers of semiconductor material.

13 Claims, 4 Drawing Sheets

OTHER PUBLICATIONS

Miyao et al., "Characterization and application of fine–patterned Si/CoSi2/Si double heterostructures fabricated by self–aligned, two–stip MBE," *Journal of Crystal Growth* 111, 1991, pp. 957–960.

Yu et al., "Structural assignments and chirality dependence in single–wall carbon nanotube raman scattering," *J. Phys. Chem. B*, 2001, pp. 6831–6837.

Erkoc et al., "Effect of chirality on the stability of carbon nanotubes: molecular–dynamics simulations," *International Journal of Modern Physics C*, 2001, pp. 865–870.

Hatzikonstantinidou et al., "Process optimization and characterisation of PBT Structures," *Physica Scripta*, 1994, pp. 226–229.

Bozler, et al, "Fabrication and Microwave Performance of the Permeable Base Transistor," IEEE Tech. Dig. Int. Electron Devices Meeting (1979) 4 pages.

Yahoo! News, May 20, 2002, "IBM Builds Tiny Transistor that Beats Silicon". (Reuters) New York.

\* cited by examiner

Figure 1
FIG. 1A
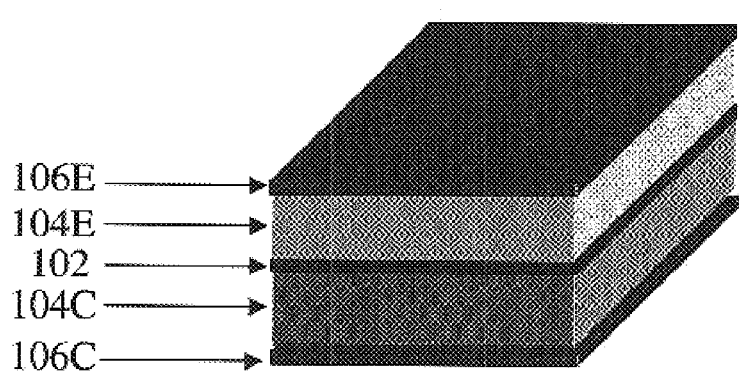
106E
104E
102
104C
106C
FIG. 1B
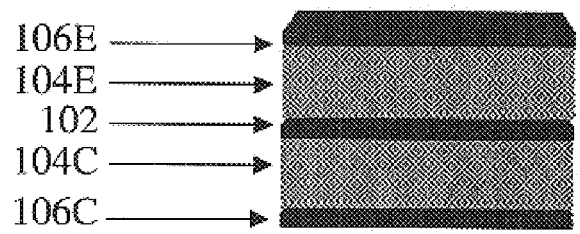
106E
104E
102
104C
106C
FIG. 1C
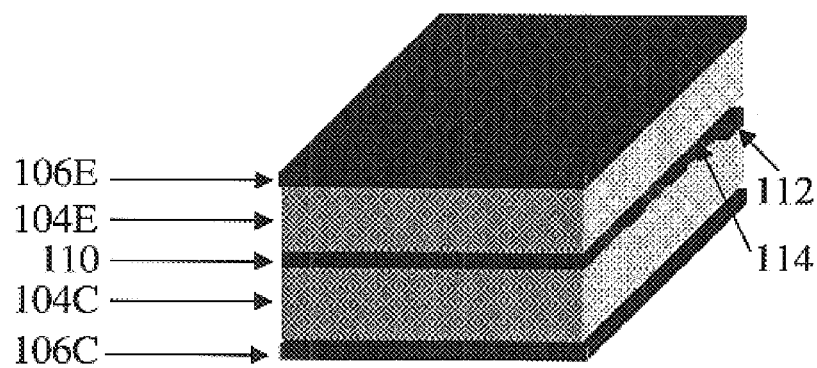
106E
104E
110
104C
106C
112
114
FIG. 1D
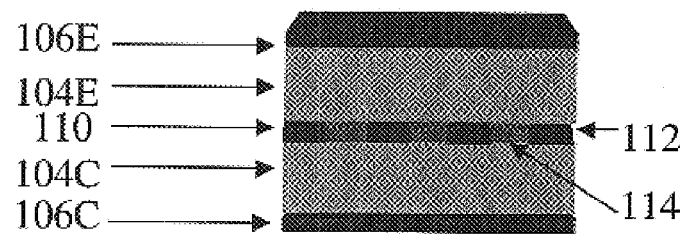
106E
104E
110
104C
106C
112
114

Figure 2
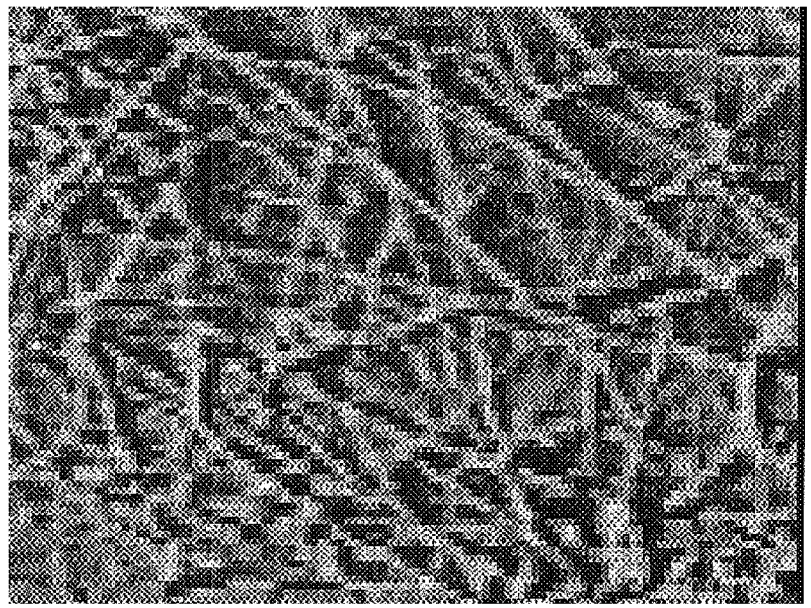
FIG. 2A
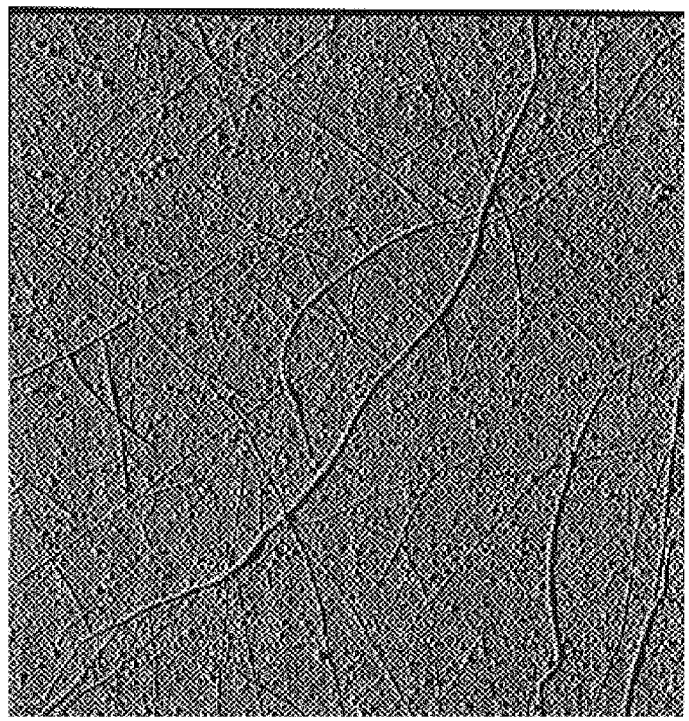
FIG. 2B

METHOD OF MAKING NANOTUBE PERMEABLE BASE TRANSISTOR

BACKGROUND

1. Technical Field

The invention relates to permeable base transistors.

2. Discussion of Related Art

Permeable base transistors (PBTs) offer advantages in speed and packing density over conventional field effect transistors (FETs) (Wemersson et al., *Mat. Sci. & Ens. B* 51:76–80 (1998); Nilsson et al., *Solid State Elec.* 42:297–305 (1998)). In typical PBT technologies, a metallic base layer is overlaid onto a single crystal semiconductor substrate (emitter/collector) to form a Schottky barrier (e.g., U.S. Pat. No. 4,378,629). A second epitaxial semiconductor layer is overgrown on the base layer (second collector/emitter). The base layer is patterned with openings so that current can flow from emitter to collector only when a voltage is applied to the base layer. A variety of metals, such as tungsten and metal silicides (e.g., $WSi_2$, $NiSi_2$ and $CoSi_2$) have been used as materials for the base layer (von Känel, *Mat. Sci. Rep.* 8:193–269 (1992); Zaring et al., *Rep. Progress Phys.* 56:1397–1467 (1993); Pisch et al., *J. App. Phys.* 80:2742–2748 (1996)). These PBTs were predicted to have high gains at very high frequencies (200 GHz), which were not achievable with conventional FET technologies. However, problems such as poisoning of PBT semiconductor structures by metal electromigration, insufficient heat dissipation, and complexity of epitaxial overgrowth to form embedded metal base layers have prevented mass fabrication of PBTs (Hsu et al., *J. App. Phys.* 69:4282–4285; Miyao et al., *J. Cryst. Growth* 111:957–960 (1991)).

Therefore, a need exists for new PBTs that provide the predicted improvements in speed, packing density, and high frequency performance over FETs, without suffering from the drawbacks associated with the metal base layers of traditional PBTs.

SUMMARY

The invention provides a method of making a permeable base transistor (PBT) having a base layer that includes nanotubes. One aspect of the invention provides a method of making a permeable base transistor. According to the method, a semiconductor substrate is provided, a base layer is provided on the substrate, and a semiconductor layer is grown over the base layer. The base layer includes metallic nanotubes.

In some embodiments, the base layer is formed by growing a carbon nanotube fabric on the substrate using a catalyst. In certain embodiments, the catalyst is a gas-phase catalyst. In particular embodiments, the catalyst is a metallic gas-phase catalyst. In other embodiments, the base layer is formed by depositing a solution or suspension of nanotubes on the substrate. In certain embodiments, the solution or suspension is deposited by spin-coating. In particular embodiments, the solution or suspension is deposited by dipping the substrate into the solution or suspension. In still other embodiments, the base layer is formed by spraying an aerosol having nanotubes onto a surface of the substrate.

In some embodiments of the method, the base layer is patterned. In certain embodiments, an ohmic contact is provided in communication with the substrate. In particular embodiments, an ohmic contact is provided in communication with the semiconductor layer. In particular embodiments, the nanotubes include single-walled carbon nanotubes. In certain embodiments, the base layer includes a monolayer of carbon nanotubes.

BRIEF DESCRIPTION OF THE DRAWING

In the Drawing,

FIGS. 1A–D illustrate permeable base transistor devices according to certain embodiments of the invention;

FIGS. 2A–B illustrate nanotube fabrics of different densities used to make certain embodiments of the invention.

DETAILED DESCRIPTION

Figure 3:
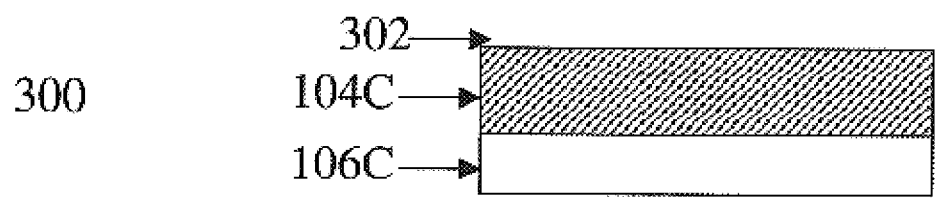
FIGS. 3–4 illustrate acts of making transistor devices according to certain embodiments of the invention.
Figure 3:
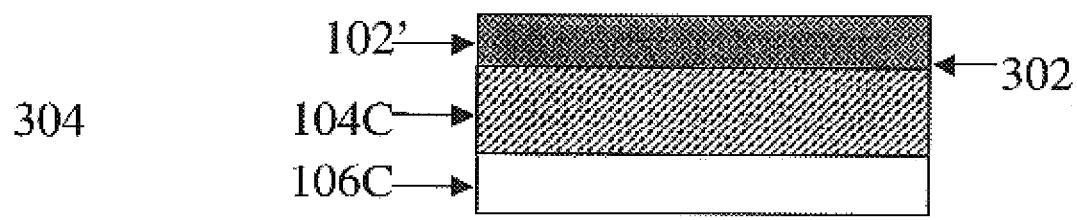
Figure 3:
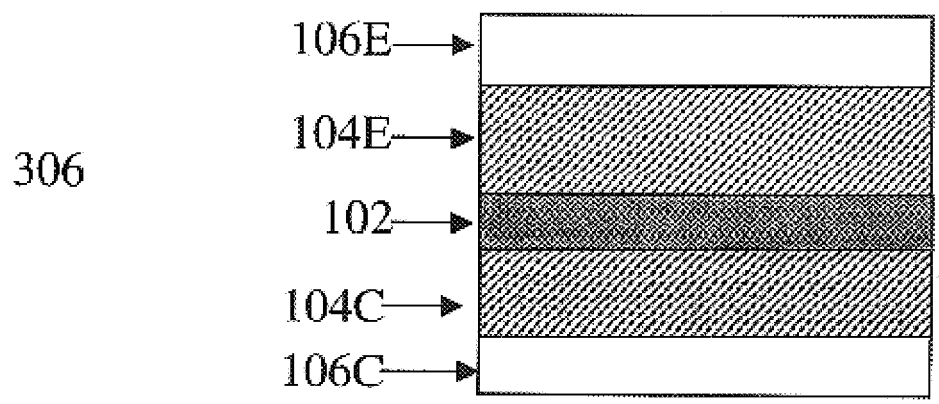

Certain embodiments of the invention provide a permeable base transistor (PBT) having a base layer including metallic nanotubes or metallic nanotube fabric embedded in a semiconductor crystal material. The metallic nanotube base layer separates emitter and collector layers of the semiconductor material. A Schottky barrier is created between the nanotube layer and each of the emitter and collector semiconductor layers. The metallic nanotube layer includes metallic nanotube species, and may also include some semiconducting nanotubes. In specific embodiments, the metallic nanotubes and semiconducting nanotubes are carbon nanotubes. In particular embodiments, the nanotube layer is a horizontal monolayer of single-walled carbon nanotubes. Nanotube layers can be thinner (e.g., about 1 nm) than traditional PBT metallic base films, while retaining low resistance and impedance. Nanotube base layers exhibit effective heat dissipation, due to the high thermal conductivity of the nanotubes.

In particular embodiments, PBTs of the invention are made by providing a semiconductor substrate, providing a nanotube layer on the substrate, and growing an epitaxial semiconductor layer over the nanotube layer. Epitaxial semiconductor growth over the nanotube layer can occur because nanotubes occupy only a small surface area of the underlying semiconductor substrate. Since the diameter of a nanotube is only about 1.5 nm, less perturbation of the epitaxial growth layer is caused by a nanotube layer than by a transition metal base layer such as cobalt, nickel, or tungsten. The porous nature of the nanotube layer allows for self-sealing epitaxial overgrowth by the semiconductor, without generating the defects associated with epitaxial growth over a traditional metallic trace. Further, ultra-small patterning of conductive base "fingers" is not required for nanotube base layers as it is for standard metallic base layers, because the nanotube fabric resembles a spider web, inherently containing openings between nanotube segments.

FIGS. 1A–D illustrate nanotube permeable base transistors (NPBTs) according to certain embodiments of the invention. Each NPBT includes an emitter 104E, a base, and a collector 104C. In certain embodiments, as shown in FIG. 1A, the base is a metallic base layer including a carbon nanotube film 102. The thickness of the base layer corresponds to the height of a nanotube matte, which is typically about 1 nm or greater. The nanotube base layer 102 is embedded within a crystalline matrix 104C,E of semiconducting material. The semiconductor matrix 104C,E is divided by the nanotube base layer 102 into an semiconducting emitter layer 104E and a semiconducting collector layer 104C. A Schottky barrier is generated between the nanotube base layer 102 and each of the emitter and collector layers 104E, 104C. FIGS. 1A–D are not drawn to scale. In certain embodiments, the thickness of each of the emitter and collector layers 104E, 104C is between about 0.1 microns and about 2 microns. The emitter and collector layers 104E, 104C electrically communicate with ohmic contacts 106E, 106C. FIG. 1B shows a side view of the NPBT illustrated in FIG. 1A.

In certain embodiments, as shown in FIG. 1C and its side view FIG. 1D, the base is a metallic layer including a patterned carbon nanotube film 110. The patterned film 110 has nanotube "fingers" or ribbons 112 separated by openings 114. The patterned film 110 may be formed using standard lithographic techniques to define a pattern in a nanotube layer. Alternatively, the patterned film 110 is generated through controlled growth of nanotubes to create a grid of varying nanotube density.

Nanotube matter and fabrics, and methods of making and patterning the same, and of defining elements therefor, are described in co-pending U.S. patent applications entitled Nanotube Films and Articles (Ser. No. 10/128118, filed Apr. 23, 2002) and Methods of Nanotube Films and Articles (Ser. No. 10/128117, filed Apr. 23, 2002), which are assigned to the assignee of this application, and which are hereby incorporated by reference in their entirety. A nanotube fabric is an aggregate of nanotube segments in which nanotube segments contact other nanotube segments to define a plurality of conductive pathways.

FIGS. 2A–B illustrate nanotube fabrics having different porosities. The height of the nanotubes as measured by atomic force microscopy (AFM) is about 1–2 nm, which is typical for monolayered single-walled nanotube films. FIG. 2A depicts a higher density, less porous nanotube film in comparison to FIG. 2B, which depicts a lower density, more porous film. The density of the nanotube matte is adjusted using nanotube growth techniques to provide smaller or larger openings between tubes. For example, the porosity of the nanotube fabric is regulated by maintaining a temperature between about 700° C. and about 1000° C. during nanotube growth, and allowing nanotube growth to occur for between about 1 minute and about 1 hour. The nature and concentration of any catalyst used to promote nanotube growth, and the flow parameters of carbon precursor gas and carrier gas also affect the density of a resulting carbon nanotube matte.

Nanotube fabrics usually contain a mixture of both semiconductor and metallic nanotube species, depending on tube chirality (Yu, et al., *J. Phys. Chem. B* 105:6831–6837 (2001); Erkoc et al., *Int. J. Modern Phys. C*, 12:865–870 (2001)). These semiconductor and metallic nanotube species are referred to herein as "semiconducting nanotubes" and "metallic nanotubes," respectively. In a PBT device having a nanotube base layer, the metallic nanotubes form a Schottky contact, while the semiconducting nanotubes remain embedded as part of the epitaxial structure without contributing to the device characteristics or disturbing the functionality of the device. The porosity of the nanotube fabric is tuned to ensure that the entire nanotube layer acts as a metal trace. The nanotube layer preferably is dense enough that the carrier depletion zone generated around each metallic nanotube covers the surrounding semiconducting nanotubes. This way the Schottky barrier created by the metallic tubes interfacing with the semiconductor matrix extends around the PBT base layer.

Multiply-connected and redundant conductive paths defined by nanotube segments in the nanotube fabric ensure reliable electrical connection of all regions of the base layer. Redundancy in the nanotube fabric also reduces the detrimental effect of surface damage associated with the deposition of epitaxial layers, which can cause delays in base transition time (Hatzikonstantinidou et al., *Phys. Scripta* 54:226–229 (1994)). The inherently open nature of the nanotube fabric leaves ample lattice sites exposed in the underlying semiconductor to facilitate epitaxial overgrowth in PBT fabrication.

FIG. 3 illustrates a method of making NPBT devices according to certain embodiments of the invention. The structures in FIG. 3 are shown in vertical cross-section. A first intermediate structure 300 is created or provided. In the illustrated embodiment, the structure 300 includes a semiconducting substrate having an ohmic contact 106C. In the illustrated embodiment, the semiconducting substrate provides a collector layer 104C formed of semiconductor material. However, in alternative embodiments the semiconducting substrate forms an emitter layer. One of skill in the art will understand that the particular nature of the semiconducting substrate, e.g., n-type or p-type semiconductor material, can be varied and is chosen based upon the structure desired.

A nanotube layer 102' is formed on an upper surface 302 of the substrate 104C to produce a second intermediate structure 304. Usually, the matted nanotube layer 102' is a non-woven fabric of single-walled nanotubes. However, certain alternative embodiments employ multi-walled nanotubes. In some embodiments, the nanotube film 102' is grown using a catalyst, which is applied to the upper surface 302 of the semiconductor substrate 104C. Sometimes, a catalyst metal containing iron (Fe), molybdenum (Mo), cobalt (Co), tungsten (W), or other metals, is applied to the surface 302 by spin-coating or other application techniques. Alternatively, or in addition, the catalyst is provided in gaseous form in a chemical vapor deposition (CVD) process. For example, carbon nanotubes are grown using a gas phase metallic species such as ferrocene or other gas phase metallic species containing iron, molybdenum, tungsten, cobalt, or other transition metals. Parameters including, but not limited to, catalyst composition and concentration, temperature, pressure, surface preparation, and growth time are adjusted to control growth of the nanotube matte 102'. For example, control of such parameters allows for even distribution of nanotubes over the surface 302 to form a layer 102' that is primarily a monolayer of nanotubes adhered to one another via van der Waals' forces. Growth of one nanotube on top of another occurs infrequently due to the growth tendencies of the material. In some embodiments, the catalyst is patterned to promote nanotube growth in varying densities.

Alternatively to growing the nanotube film 102', a film 102' of pre-grown nanotubes is deposited on the surface 302 of the semiconductor substrate 104C. In some embodiments, nanotubes are dissolved or suspended in a liquid and spin-coated over the surface 302 to generate the nanotube film 102'. The film 102' is one or more nanotubes thick, depending on the spin profile and other process parameters. Appropriate liquids for use in solutions or suspensions for spin-coating of nanotubes include, but are not limited to, dimethylformamide, n-methyl pyrollidinone, n-methyl formamide, orthodichlorobenzene, paradichlorobenzene, 1,2, dichloroethane, alcohols, and water with appropriate surfactants, such as, for example, sodium dodecylsulfate or TRITON X-100. The nanotube concentration and deposition parameters, such as surface functionalization, spin-coating speed, temperature, pH, and time, are adjusted to control deposition of monolayers or multilayers of nanotubes as desired. In other embodiments, the nanotube film 102' is deposited by dipping the surface 302 of the semiconductor structure 300 into a solution or suspension of nanotubes. In still other embodiments, the nanotube film 102' is formed by spraying pre-formed nanotubes in the form of an aerosol onto the surface 302 of the semiconductor structure 300.

The NPBT structure 306 is created by growing an epitaxial semiconductor layer over the nanotube film 102'. In the illustrated embodiment, this epitaxial semiconductor layer serves as an emitter layer 104E, but in alternative embodiments this epitaxial layer serves as a collector layer. Since the nanotube layer 102' is porous, the epitaxial layer 104E grows not only over the nanotube base layer 102', but also between nanotubes of the layer 102', thereby generating a fully embedded nanotube film 102 that creates only slight perturbations in the epitaxial nature of the upper semiconductor layer 104E with respect to the semiconductor substrate 104C. In the illustrated embodiment, the epitaxial layer 104E is interfaced to a second ohmic contact 106E. One of skill in the art will understand that ohmic contacts to the PBT are provided as necessary to afford desired connections within and between devices.

Figure 4:
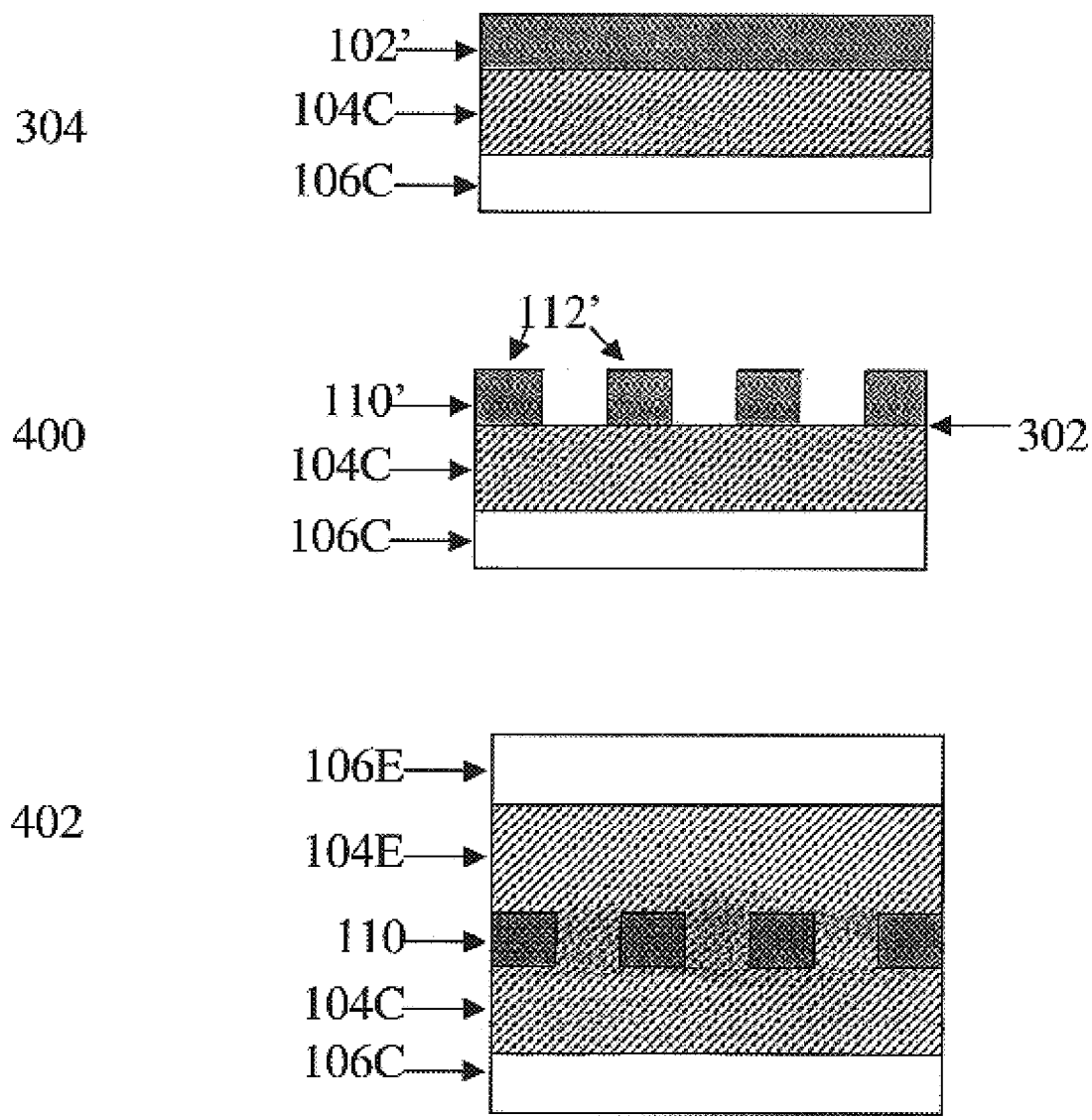

In another embodiment, as shown in FIG. 4, an intermediate structure 304 is generated as described above. The structures in FIG. 4 are shown in vertical cross-section. A photoresist is applied to the nanotube layer 102' and patterned to define ribbons or fingers in the matted layer of nanotubes 102'. The photoresist is removed to form a third intermediate structure 400 having a patterned nanotube film 110' made up of ribbons 112' of non-woven nanotube fabric lying on planar surface 302. An epitaxial semiconductor layer is grown over the patterned nanotube film 110'. In NPBT 402, this epitaxial semiconductor layer is shown as an emitter layer 104E, but in alternative embodiments this epitaxial layer serves as a collector layer. Since the nanotube layer 110' is porous and extremely thin (e.g., about 1 nm), the epitaxial layer 104E grows not only over the nanotube base layer 110' but also between nanotubes, generating a fully embedded patterned nanotube film 110, which creates only slight perturbations in the epitaxial nature of the upper semiconductor layer 104E with respect to the semiconductor substrate 104C. In the illustrated embodiment, the layer 104E is interfaced to a second ohmic contact 106E. One of skill in the art will understand that ohmic contacts to the PBT are provided as necessary to afford desired connections within and between devices.

FIGS. 1, 3, and 4 illustrate a transistor layout according to certain embodiments of the invention, having ohmic contacts 106E, 106C above the emitter layer 104E and below the collector layer 104C. However, one of skill in the art will appreciate that various configurations for transistors are known, e.g., well-based, trench-based, and vertical stacking, all of which are applicable to PBTs according to various embodiments of the invention.

It will be further appreciated that the scope of the present invention is not limited to the above-described embodiments but rather is defined by the appended claims, and that these claims will encompass modifications of and improvements to what has been described.

What is claimed is:

1. A method of making a permeable base transistor comprising:

(a) providing a semiconductor substrate;

(b) providing a base layer on the substrate, wherein the base layer includes metallic nanotubes and wherein the base layer is a base of the permeable base transitor; and (c) growing a semiconductor layer over the base layer, wherein one of the semiconductor substrate and semiconductor layer is an emitter of the permeable base transistor and the other of the semiconductor substrate and semiconductor layer is a collector of the permeable base transistor.

2. The method of claim 1, wherein the base layer is formed by growing a carbon nanotube fabric on the substrate using a catalyst.

3. The method of claim 2, wherein the catalyst is a gas-phase catalyst.

4. The method of claim 3, wherein the catalyst is a metallic gas-phase catalyst.

5. The method of claim 1, wherein the base layer is formed by depositing a solution or suspension of nanotubes on the substrate.

6. The method of claim 5, wherein the solution or suspension is deposited by spin-coating.

7. The method of claim 5, wherein the solution or suspension is deposited by dipping the substrate into the solution or suspension.

8. The method of claim 1, wherein the base layer is formed by spraying an aerosol having nanotubes onto a surface of the substrate.

9. The method of claim 1, further comprising patterning the base layer.

10. The method of claim 1, further comprising providing an ohmic contact in communication with the substrate.

11. The method of claim 1, further comprising providing an ohmic contact in communication with the semiconductor layer.

12. The method of claim 1, wherein the nanotubes include single-walled carbon nanotubes.

13. The method of claim 1, wherein the base layer includes a monolayer of carbon nanotubes.

* * * * *